(12) United States Patent
Chang (10) Patent No.: US 11,693,439 B2
(45) Date of Patent: Jul. 4, 2023

(54) VOLTAGE REGULATOR CAPABLE OF PROVIDING STABLE OUTPUT VOLTAGE SIGNAL

(71) Applicant: GUTSCHSEMI LIMITED, Hong Kong (HK)

(72) Inventor: Kuo-Wei Chang, Taipei (TW)

(73) Assignee: GUTSCHSEMI LIMITED, Hong Kong (HK)

( * ) Notice: Subject to any disclaimer, the term of this patent is extended or adjusted under 35 U.S.C. 154(b) by 93 days.

(21) Appl. No.: 17/409,735

(22) Filed: Aug. 23, 2021

(65) Prior Publication Data
US 2022/0382308 A1 Dec. 1, 2022

Related U.S. Application Data

(60) Provisional application No. 63/192,583, filed on May 25, 2021.

(51) Int. Cl.
*G05F 1/575* (2006.01)
*G05F 1/56* (2006.01)

(52) U.S. Cl.
CPC ............... *G05F 1/575* (2013.01); *G05F 1/56* (2013.01)

(58) Field of Classification Search
CPC ...................................................... G05F 1/575
See application file for complete search history.

(56) References Cited

U.S. PATENT DOCUMENTS

| 6,300,749 | B1 | 10/2001 | Castelli et al. | |
| 7,843,180 | B1 | 11/2010 | Cilingiroglu | |
| 8,115,463 | B2 | 2/2012 | Wang | |
| 9,753,475 | B2 * | 9/2017 | Lin | G05F 1/575 |
| 2003/0214275 | A1 * | 11/2003 | Biagi | G05F 1/575 323/280 |
| 2004/0164789 | A1 * | 8/2004 | Leung | G05F 1/575 327/546 |
| 2008/0303496 | A1 | 12/2008 | Schlueter et al. | |
| 2009/0115382 | A1 * | 5/2009 | Hasegawa | G05F 1/575 323/273 |
| 2013/0033244 | A1 * | 2/2013 | Ock | G05F 1/56 323/280 |

(Continued)

FOREIGN PATENT DOCUMENTS

CN 103885518 6/2014
CN 210469231 U * 5/2020

(Continued)

OTHER PUBLICATIONS

"Office Action of Taiwan Counterpart Application", dated Apr. 22, 2022, p. 1-p. 8.

*Primary Examiner* — Sisay G Tiku
(74) *Attorney, Agent, or Firm* — JCIPRNET (57) ABSTRACT

A voltage regulator is provided. The voltage regulator includes a level shifter, a low-pass filter, and a voltage regulating circuit. The level shifter shifts a voltage value of a reference voltage signal to generate a set voltage signal. The low-pass filter filters the set voltage signal to generate a filtered voltage signal. The voltage regulating circuit outputs an output voltage signal according to the filtered voltage signal and adjusts a voltage value of the filtered voltage signal according to a change of the output voltage signal to stabilize a voltage value of the output voltage signal.

8 Claims, 7 Drawing Sheets

(56) References Cited

U.S. PATENT DOCUMENTS

| | | | | |
|---|---|---|---|---|
| 2013/0176006 | A1* | 7/2013 | van Ettinger | G05F 1/40 323/265 |
| 2015/0355653 | A1* | 12/2015 | Drebinger | H03F 3/34 323/280 |
| 2018/0090928 | A1* | 3/2018 | Bach | G01R 19/16585 |
| 2019/0235543 | A1* | 8/2019 | Chen | G05F 1/575 |
| 2020/0358413 | A1* | 11/2020 | Wong | H05B 45/3725 |
| 2021/0397207 | A1* | 12/2021 | Joo | G05F 1/575 |

FOREIGN PATENT DOCUMENTS

| | | | | |
|---|---|---|---|---|
| EP | 1365302 | B1 * | 4/2010 | G05F 1/575 |
| EP | 2952995 | A1 * | 12/2015 | G05F 1/575 |
| TW | 201239570 | | 10/2012 | |
| TW | 201701098 | | 1/2017 | |
| TW | 201715326 | | 5/2017 | |
| TW | I669584 | | 8/2019 | |

* cited by examiner

VOLTAGE REGULATOR CAPABLE OF PROVIDING STABLE OUTPUT VOLTAGE SIGNAL

CROSS-REFERENCE TO RELATED APPLICATION

This application claims the priority benefit of U.S. provisional application Ser. No. 63/192,583, filed on May 25, 2021. The entirety of the above-mentioned patent application is hereby incorporated by reference herein and made a part of this specification.

BACKGROUND

Technology Field

The disclosure relates to a power supply field, and particularly to a voltage regulator.

Description of Related Art

Voltage regulators are power management integrated circuits (PMICs). The voltage regulators can be used to manage the power demand of the host system. The voltage regulators can be used in battery-powered devices, such as smartphones, laptops, tablets, wearable devices, and the like to control the flow and direction of power in the devices. For a voltage regulator to operate stably, how to make the voltage regulator have a fast load response and provide a stable output voltage signal is one of the research and development focuses of those skilled in the art.

SUMMARY

The disclosure provides a voltage regulator having fast load response and capable of providing a stable output voltage signal.

The voltage regulator of the disclosure includes a level shifter, a low-pass filter, and a voltage regulating circuit. The level shifter shifts a voltage value of a reference voltage signal to generate a set voltage signal. The low-pass filter is coupled to the level shifter. The low-pass filter filters the set voltage signal to generate a filtered voltage signal. The voltage regulating circuit is coupled to the low-pass filter. The voltage regulating circuit outputs an output voltage signal according to the filtered voltage signal and adjusts a voltage value of the filtered voltage signal according to a change of the output voltage signal to stabilize a voltage value of the output voltage signal.

In summary, the voltage regulator may shift the voltage value of the reference voltage signal to generate a set voltage signal and then filter the shifted set voltage signal. The voltage regulating circuit provides an output voltage signal based on the filtered voltage signal. Accordingly, the output voltage signal has very low noise. Moreover, the voltage regulating circuit also adjusts the voltage value of the filtered voltage signal according to a change of the output voltage signal. Therefore, the voltage value of the output voltage signal can be stabilized.

In order to make the aforementioned features and advantages of the disclosure comprehensible, embodiments accompanied with drawings are described in detail below.

DESCRIPTION OF THE EMBODIMENTS

Some embodiments of the disclosure will be described in detail with reference to the accompanying drawings. For reference numerals cited in the following descriptions, the same reference numerals appearing in different drawings are regarded as the same or similar elements. The embodiments are only a part of the disclosure and do not disclose all possible implementations of the disclosure. More precisely, the embodiments are merely examples of the device and the method.

Figure 1:
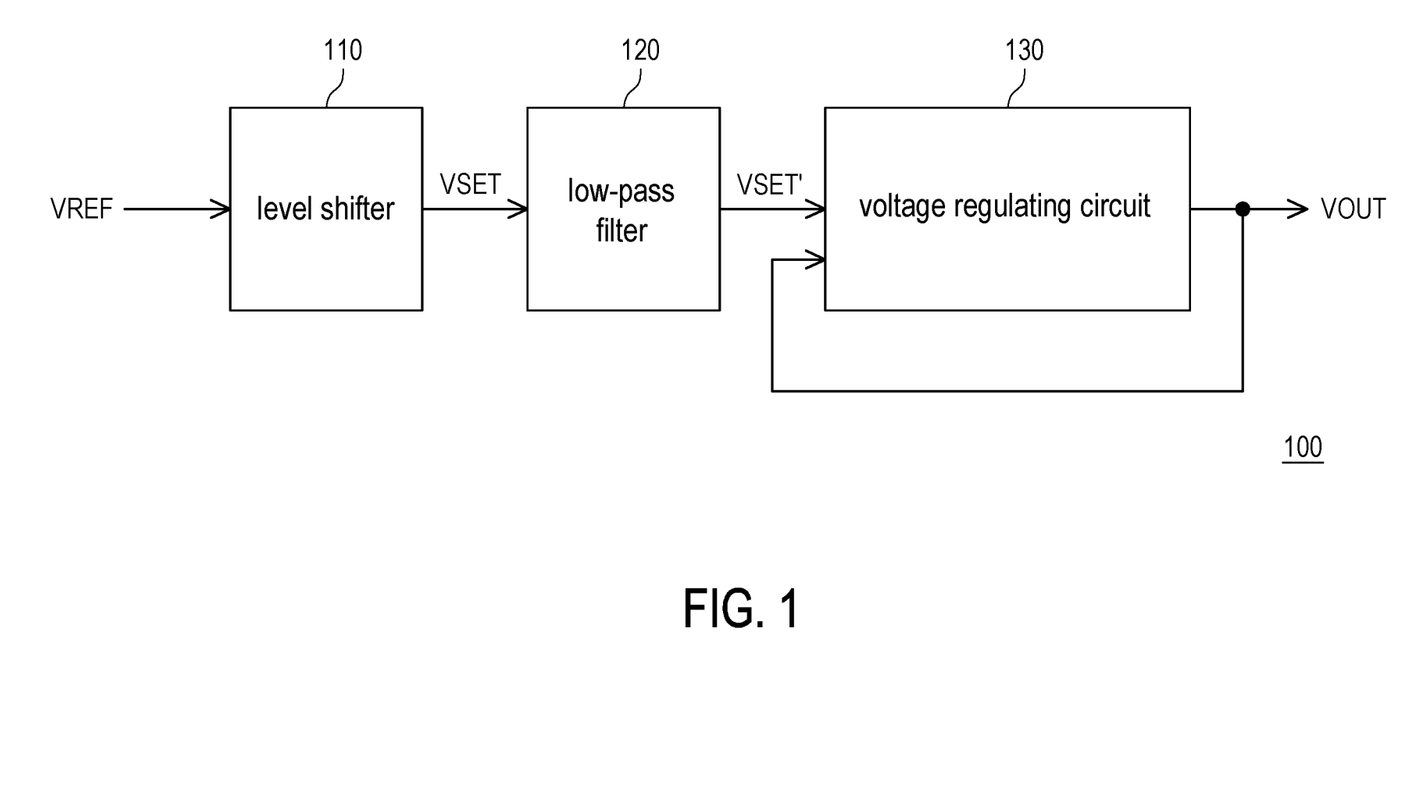
FIG. 1 is a schematic view of a voltage regulator according to a first embodiment of the disclosure.

Referring to FIG. 1, FIG. 1 is a schematic view of a voltage regulator according to a first embodiment of the disclosure. In the embodiment, a voltage regulator 100 includes a level shifter 110, a low-pass filter 120, and a voltage regulating circuit 130. The level shifter 110 receives a reference voltage signal VREF and shifts the voltage value of the reference voltage signal VREF to generate a set voltage signal VSET. The low-pass filter 120 is coupled to the level shifter 110. The low-pass filter 120 filters the set voltage signal VSET to generate a filtered voltage signal VSET'. In the embodiment, the low-pass filter 120 can be used to filter the mid-frequency and high-frequency noise of the set voltage signal VSET, thereby generating the filtered voltage signal VSET'. Furthermore, the filtered voltage signal VSET' is substantially a DC voltage signal.

In the embodiment, the voltage regulating circuit 130 is coupled to the low-pass filter 120. The voltage regulating circuit 130 outputs an output voltage signal VOUT according to the filtered voltage signal VSET'. The voltage regulating circuit 130 adjusts the voltage value of the filtered voltage signal VSET' according to the change of the output voltage signal VOUT, thereby stabilizing the voltage value of the output voltage signal VOUT. The change in the output voltage signal VOUT may be a change in the load, which causes the voltage value of the output voltage signal VOUT to change. Therefore, the voltage regulating circuit 130 can use the change of the output voltage signal VOUT as a feedback signal to adjust the voltage value of the filtered voltage signal VSET'. Therefore, the voltage value of the output voltage signal VOUT can be stabilized within a specific voltage value scope. In the embodiment, the voltage regulating circuit 130 may be implemented by a low dropout (LDO) voltage regulator.

Note that the low-pass filter 120 can filter the mid-frequency and high-frequency noise of the reference voltage signal VREF and/or the mid-frequency and high-frequency noise derived from the reference voltage signal VREF after being level-processed. The voltage regulating circuit 130 outputs the output voltage signal VOUT according to the filtered voltage signal. Accordingly, the output voltage signal VOUT provided by the voltage regulator 100 has very low noise. Moreover, the voltage regulating circuit 130 also adjusts the voltage value of the filtered voltage signal VSET' according to the change of the output voltage signal VOUT. Therefore, the voltage value of the output voltage signal VOUT can be stabilized.

Figure 2:
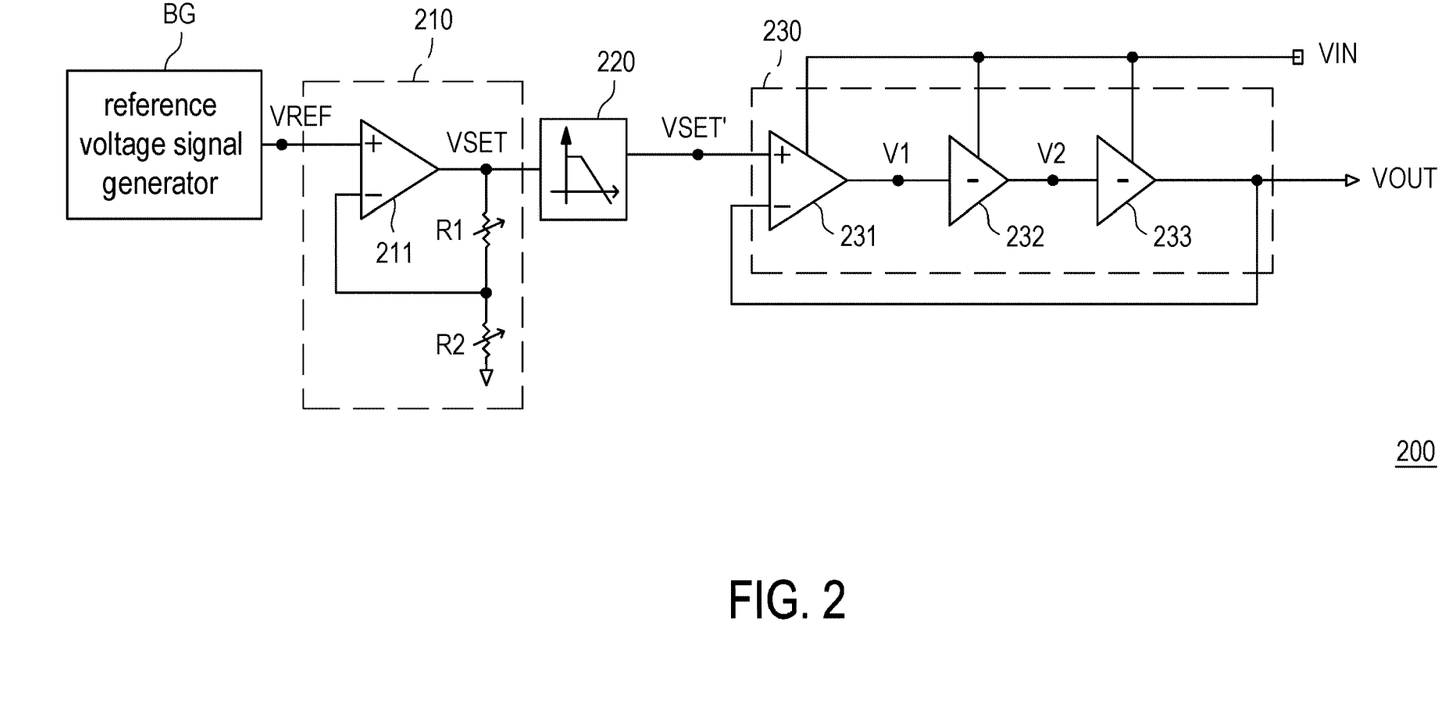
FIG. 2 is a schematic view of a voltage regulator according to a second embodiment of the disclosure.

Referring to FIG. 2, FIG. 2 is a schematic view of a voltage regulator according to a second embodiment of the disclosure. In the embodiment, a voltage regulator 200 includes a reference voltage signal generator BG, a level shifter 210, a low-pass filter 220, and a voltage regulating circuit 230. The reference voltage signal generator BG is coupled to the level shifter 210. The reference voltage signal generator BG is used to provide the reference voltage signal VREF. The reference voltage signal generator BG can be implemented by a bandgap voltage generator.

The level shifter 210 includes an operational amplifier 211, a first variable resistor R1, and a second variable resistor R2. The non-inverting input terminal of the operational amplifier 211 is used to receive the reference voltage signal VREF. The inverting input terminal of the operational amplifier 211 is coupled to a voltage dividing node. The first variable resistor R1 is coupled between the output terminal of the operational amplifier 211 and the voltage dividing node. The second variable resistor R2 is coupled between the voltage dividing node and the reference low voltage (e.g., ground). In the embodiment, the first variable resistor R1 and the second variable resistor R2 can be adjusted to determine the voltage value of the set voltage signal VSET. Based on the circuit configuration of the level shifter 210, the voltage value of the set voltage signal VSET can be obtained based on formula (1):

$$v\_VSET = v\_VREF \times (1 + r\_R1/r\_R2) \quad \text{Formula (1)}$$

v_VSET is the voltage value of the set voltage signal VSET. v_VREF is the voltage value of the reference voltage signal VREF. r_R1 is the adjusted resistance value of the first variable resistor R1. r_R2 is the adjusted resistance value of the second variable resistor R2.

In the embodiment, the implementation of the low-pass filter 220 is similar to the implementation of the low-pass filter 120 in the first embodiment, which is accordingly not iterated herein.

In the embodiment, the voltage regulating circuit 230 includes a first error amplifier 231, a first buffer 232, and a second buffer 233. The first error amplifier 231, the first buffer 232, and the second buffer 233 may be driven by a driving voltage VIN. The non-inverting input terminal of the first error amplifier 231 is used to receive the filtered voltage signal VSET'. The inverting input terminal of the first error amplifier 231 is used to receive the output voltage signal VOUT. The output terminal of the first error amplifier 231 is used to output a first voltage signal V1. The first buffer 232 is coupled to the output terminal of the first error amplifier 231. The first buffer 232 receives the first voltage signal V1 and provides a second voltage signal V2 according to the first voltage signal V1. The first buffer 232 outputs the second voltage signal V2 at the output terminal of the first buffer 232. The second buffer 233 is coupled to the output terminal of the first buffer 232. The second buffer 233 receives the second voltage signal V2 and provides an output voltage signal VOUT according to the second voltage signal V2.

Figure 3:
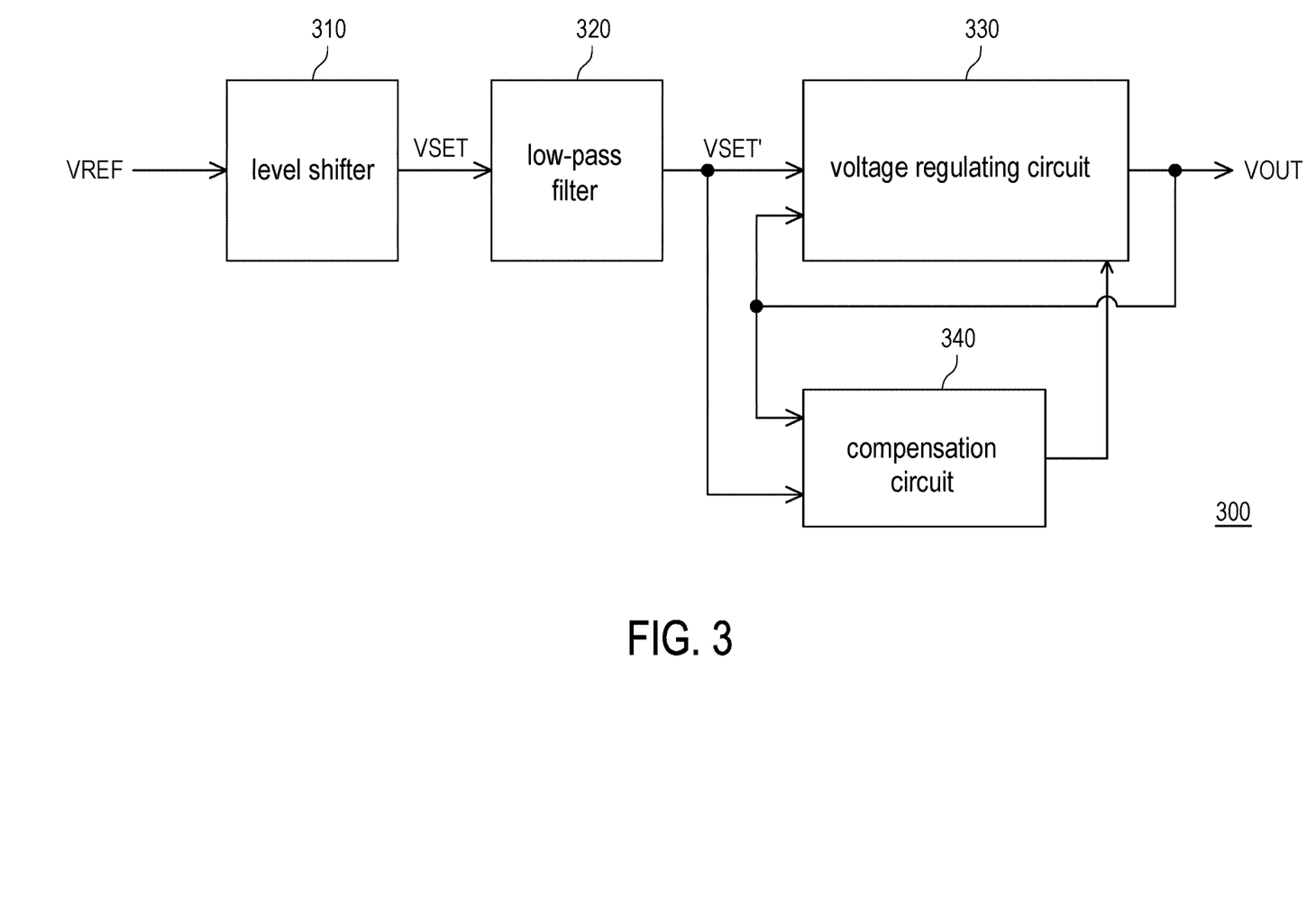
FIG. 3 is a schematic view of a voltage regulator according to a third embodiment of the disclosure.

Referring to FIG. 3, FIG. 3 is a schematic view of a voltage regulator according to a third embodiment of the disclosure. In the embodiment, the voltage regulator 300 includes a level shifter 310, a low-pass filter 320, a voltage regulating circuit 330, and a compensation circuit 340. The implementation of the level shifter 310, the low-pass filter 320, and the voltage regulating circuit 330 can be sufficiently taught in the embodiments of FIG. 1 and FIG. 2, which is accordingly not iterated herein. In the embodiment, the compensation circuit 340 is coupled to the low-pass filter 320 and the voltage regulating circuit 330. The compensation circuit 340 provides a compensation signal according to the output voltage signal VOUT and the filtered voltage signal VSET'. In the embodiment, the compensation circuit 340 can provide high-frequency transient compensation for the operation of the voltage regulating circuit 330.

Figure 4:
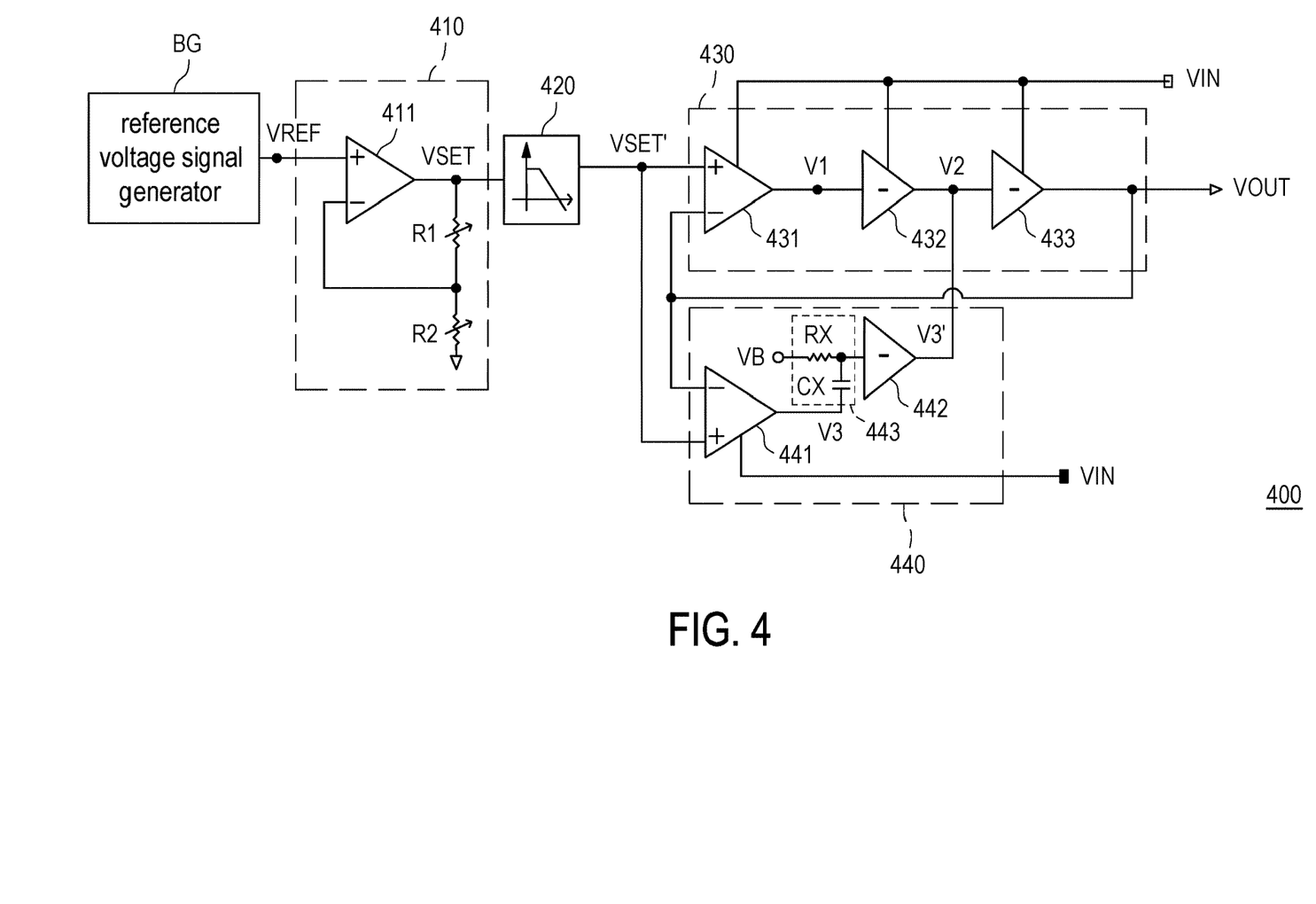
FIG. 4 is a schematic view of a voltage regulator according to a fourth embodiment of the disclosure.

To further illustrate the implementation details of the compensation circuit, refer to FIG. 4. FIG. 4 is a schematic view of a voltage regulator according to a fourth embodiment of the disclosure. A voltage regulator 400 includes a reference voltage signal generator BG, a level shifter 410, a low-pass filter 420, a voltage regulating circuit 430, and a compensation circuit 440. The level shifter 410 includes an operational amplifier 411, the first variable resistor R1, and the second variable resistor R2. The voltage regulating circuit 430 includes a first error amplifier 431, a first buffer 432, and a second buffer 433. The implementation of the level shifter 410, the low-pass filter 420, and the voltage regulating circuit 430 can be sufficiently taught in the embodiment of FIG. 2, which is accordingly not iterated herein.

In the embodiment, the compensation circuit 440 includes a second error amplifier 441, a third buffer 442, and a high-pass filter 443. The non-inverting input terminal of the second error amplifier 441 is used to receive the filtered voltage signal VSET'. The inverting input terminal of the second error amplifier 441 is used to receive the output voltage signal VOUT. The output terminal of the second error amplifier 441 is used to output a third voltage signal V3. The third buffer 442 is coupled between the output terminal of the second error amplifier 441 and the output terminal of the second buffer 433. The third buffer 442 generates a compensation signal V3' according to the third voltage signal V3 and provides the compensation signal V3' to the output terminal of the second buffer 433. The compensation signal V3' is used to compensate the voltage value of the second voltage signal V2. The high-pass filter 443 is coupled between the output terminal of the second error amplifier 441 and the input terminal of the third buffer 442. The high-pass filter 443 only retains the high-frequency fluctuations of the third voltage signal V3 and filters out the middle and low frequency components of the third voltage signal V3. Therefore, the compensation signal V3' is a high-frequency AC signal.

In the embodiment, the current consumption of the second error amplifier 441 is designed to be only one tenth of the current consumption of the first error amplifier 431. Therefore, the power consumption of the second error amplifier 441 is low. The power consumption of the second error amplifier 441 can be almost ignored. Moreover, the second error amplifier 441 is implemented by a trans-impedance amplifier (TIA) having a high bandwidth. Therefore, the response speed of the second error amplifier 441 is faster than the response speed of the first error amplifier 431. Therefore, the response speed of the second error amplifier 441 in response to changes in the load is significantly faster than the response speed of the first error amplifier 431 in response to changes in the load.

The second error amplifier 441 and the third buffer 442 may form a low dropout (LDO) voltage regulator.

Note that the response speed of the second error amplifier 441 is faster than the response speed of the first error amplifier 431, and the compensation signal V3' is a high-frequency signal. Accordingly, the compensation circuit 440 can provide a transient response in response to high-frequency changes at the load end, and thereby the corresponding high-frequency compensation signal V3' can be provided in time.

In the embodiment, the high-pass filter 443 includes a capacitor CX and a resistor RX. The capacitor CX is coupled between the output terminal of the second error amplifier 441 and the input terminal of the third buffer 442. The resistor RX is coupled between the input terminal of the third buffer 442 and a bias voltage VB. The bias voltage VB is a reference bias voltage for the operation of the third buffer 442.

Figure 5:
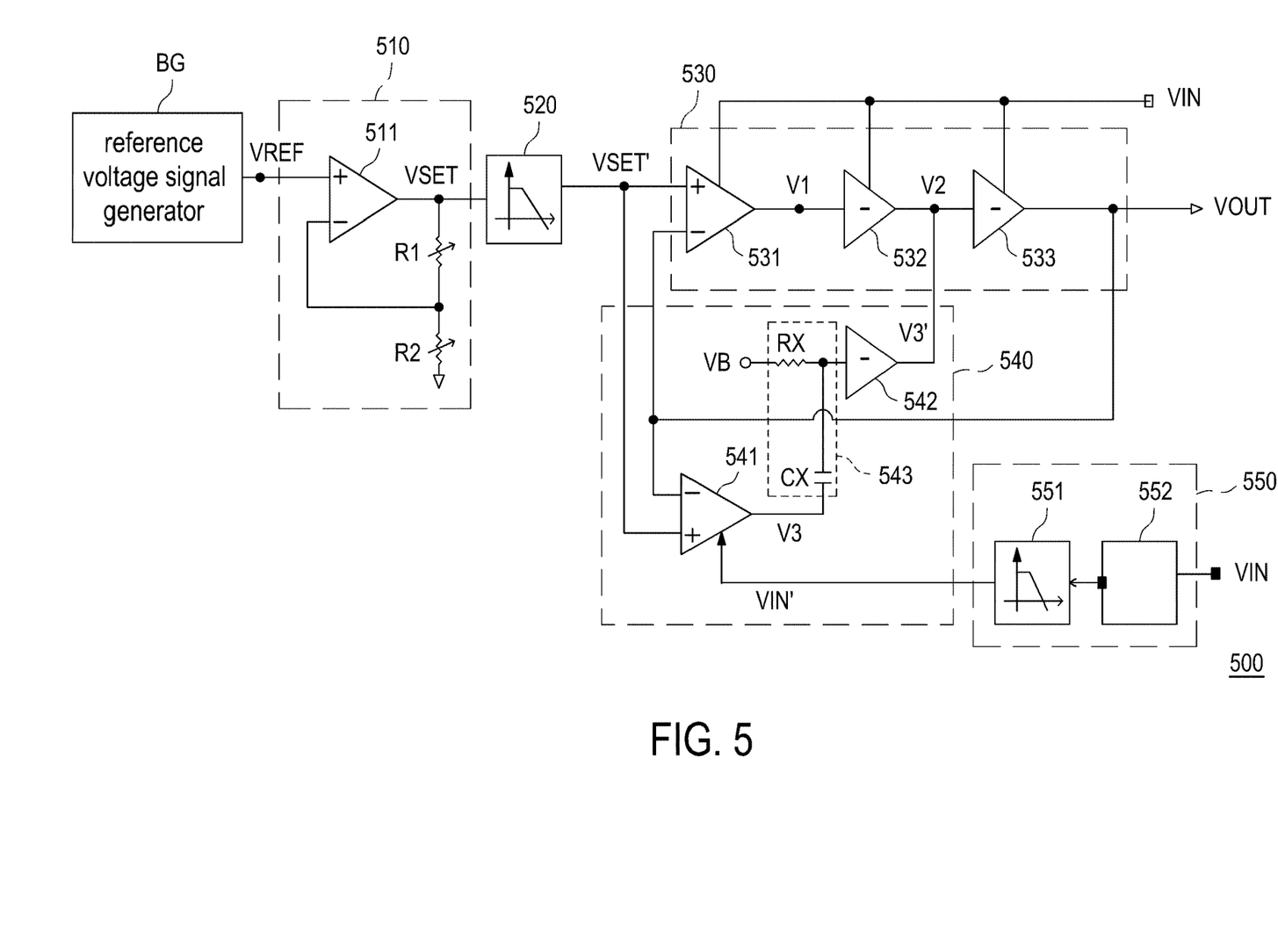
FIG. 5 is a schematic view of a voltage regulator according to a fifth embodiment of the disclosure.

Referring to FIG. 5, FIG. 5 is a schematic view of a voltage regulator according to a fifth embodiment of the disclosure. A voltage regulator 500 includes the reference voltage signal generator BG, a level shifter 510, a low-pass filter 520, a voltage regulating circuit 530, a compensation circuit 540, and a driving voltage regulating circuit 550. The level shifter 510 includes an operational amplifier 511, the first variable resistor R1, and the second variable resistor R2. The voltage regulating circuit 530 includes a first error amplifier 531, a first buffer 532, and a second buffer 533. The compensation circuit 540 includes a second error amplifier 541, a third buffer 542, and a high-pass filter 543. The implementation of the level shifter 510, the low-pass filter 520, the voltage regulating circuit 530, and the compensation circuit 540 can be sufficiently taught in the embodiment of FIG. 4, which is accordingly not iterated herein.

In the embodiment, the driving voltage regulating circuit 550 is coupled to the compensation circuit 540. The driving voltage regulating circuit 550 stabilizes the voltage value of the driving voltage VIN. The driving voltage VIN is at least a power source for driving the second error amplifier 541 of the compensation circuit 540. Therefore, the second error amplifier 541 can operate based on the stable driving voltage VIN. Note that the second error amplifier 541 has a faster response speed. The second error amplifier 541 is sensitive to the fluctuations in the driving voltage VIN (e.g., less than or equal to 0.3 volts). Therefore, the second error amplifier 541 fluctuates based on the fluctuation of the driving voltage VIN. That is, the second error amplifier 541 needs a stable driving voltage VIN.

In the embodiment, the driving voltage regulating circuit 550 includes a driving voltage low-pass filter 551 and a low dropout voltage regulator 552. The low dropout voltage regulator 552 receives the driving voltage and stabilizes the driving voltage. The driving voltage low-pass filter 551 is coupled to the low dropout voltage regulator 552. The driving voltage low-pass filter 551 filters mid-frequency and high-frequency noise of the driving voltage VIN to provide a filtered driving voltage VIN'. Accordingly, the driving voltage regulating circuit 550 can perform a stabilization operation by the driving voltage VIN and then filter out mid-frequency and high-frequency noise of the regulated driving voltage VIN to provide the filtered driving voltage VIN'. Therefore, the voltage value of the filtered driving voltage VIN' is stable and with no mid-frequency and high-frequency noise. Therefore, the voltage regulator 500 has a relatively high power supply rejection ratio (PSRR).

In some embodiments, the filtered driving voltage VIN' can be used to drive the first error amplifier 531, the first buffer 532, and the second buffer 533.

The implementation of the first error amplifier, the first buffer, the second buffer, the second error amplifier, and the third buffer at low cost is illustrated in the subsequent paragraphs.

Figure 6:
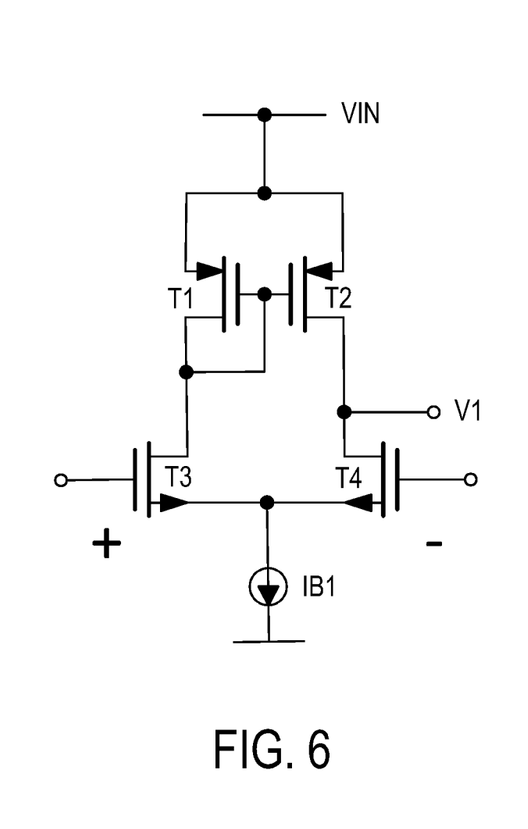
FIG. 6 is a schematic view of the circuit of a first error amplifier according to an embodiment of the disclosure.

Referring to FIG. 6, FIG. 6 is a schematic view of the circuit of the first error amplifier according to an embodiment of the disclosure. In the embodiment, the first error amplifier includes transistors T1 to T4 and a current source IB1. The transistors T1 and T2 are P-type metal-oxide-semiconductor field-effect transistors (MOSFETs), respectively. The transistors T3 and T4 are N-type MOSFETs, respectively. The source terminal of the transistor T1 is coupled to the driving voltage VIN. The gate terminal of the transistor T1 is coupled to the drain terminal of the transistor T1. The source terminal of the transistor T2 is coupled to the driving voltage VIN. The gate terminal of the transistor T2 is coupled to the gate terminal of the transistor T1. The drain terminal of the transistor T2 is used as the output terminal of the first error amplifier. The drain terminal of the transistor T3 is coupled to the drain terminal of the transistor T1. The gate terminal of the transistor T3 serves as the non-inverting input terminal of the first error amplifier. The drain terminal of the transistor T4 is coupled to the drain terminal of the transistor T2. The gate terminal of the transistor T4 serves as the inverting input terminal of the first error amplifier. The source terminal of the transistor T4 is coupled to the source terminal of the transistor T3. The current source IB1 is coupled between the source terminals of the transistors T3 and T4 and the reference low voltage. The first error amplifier shown in FIG. 6 is applicable to the first error amplifier 231 of FIG. 2, the first error amplifier 431 of FIG. 4, and the first error amplifier 531 of FIG. 5.

Figure 7:
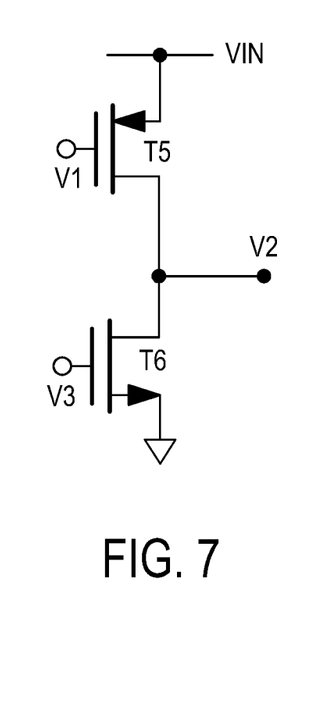
FIG. 7 is a schematic view of the circuit of a first buffer and a third buffer according to an embodiment of the disclosure.

Referring to FIG. 7, FIG. 7 is a schematic view of the circuit of the first buffer and the third buffer according to an embodiment of the disclosure. In the embodiment, the transistor T5 can be used as the first buffer. Transistor T6 can be used as the third buffer. The transistor T5 may be a P-type MOSFET. Transistor T6 may be an N-type MOSFET. The source terminal of the transistor T5 is coupled to the driving voltage VIN. The gate terminal of the transistor T5 serves as the input terminal of the first buffer to receive the first voltage signal V1. The drain terminal of the transistor T5 serves as the output terminal of the first buffer to output the second voltage signal V2. The transistor T5 is applicable to the first buffer 232 in FIG. 2, the first buffer 432 in FIG. 4, and the first buffer 532 in FIG. 5.

The drain terminal of the transistor T6 serves as the output terminal of the third buffer. The source terminal of the transistor T6 is coupled to the reference low voltage. The gate terminal of the transistor T6 serves as the input terminal of the third buffer to receive the filtered third voltage signal V3. The transistor T6 is applicable to the third buffer 442 of FIG. 4 and the third buffer 542 of FIG. 5.

In the embodiment, the transistors T5 and T6 may be operated to operate in the linear ohmic region.

Figure 8:
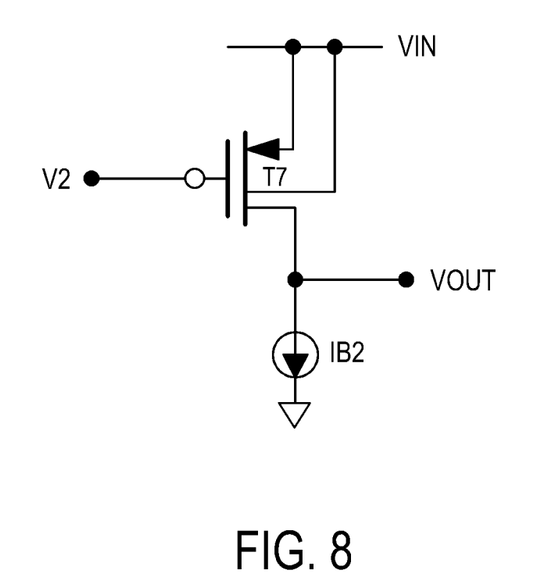
FIG. 8 is a schematic view of the circuit of a second buffer according to an embodiment of the disclosure.

Referring to FIG. 8, FIG. 8 is a schematic view of the circuit of the second buffer according to an embodiment of the disclosure. In the embodiment, the second buffer includes a transistor T7 and a current source IB2. The transistor T7 is a P-type MOSFET. The source terminal and the base terminal of the transistor T7 are coupled to the driving voltage VIN. The gate terminal of the transistor T7 serves as the input terminal of the second buffer to receive the second voltage signal V2. The drain terminal of the transistor T5 serves as the output terminal of the first buffer to output the output voltage signal VOUT. The second buffer shown in FIG. 8 may be applicable to the second buffer 233 of FIG. 2, the second buffer 433 of FIG. 4, and the second buffer 533 of FIG. 5.

Figure 9:
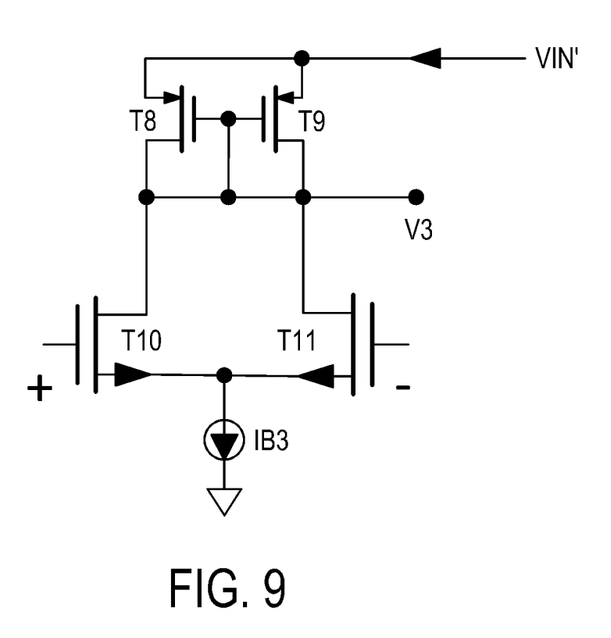
FIG. 9 is a schematic view of the circuit of a second error amplifier according to an embodiment of the disclosure.

Referring to FIG. 9, FIG. 9 is a schematic view of the circuit of the second error amplifier circuit according to an embodiment of the disclosure. In the embodiment, the second error amplifier includes transistors T8 to T11 and a current source IB3. The transistors T8 and T9 are P-type MOSFETs, respectively. The transistors T10 and T11 are N-type MOSFETs, respectively. The source terminal of the transistor T8 is coupled to the filtered driving voltage VIN'. The gate terminal of the transistor T8 is coupled to the drain terminal of the transistor T8. The source terminal of the transistor T9 is coupled to the filtered driving voltage VIN'. The gate terminal of the transistor T9 is coupled to the gate terminal of the transistor T8. The drain terminal of the transistor T9 serves as the output terminal of the second error amplifier. The drain terminal of the transistor T10 is coupled to the drain terminal of the transistor T8. The gate terminal of the transistor T10 serves as the non-inverting input terminal of the second error amplifier. The drain terminal of the transistor T11 is coupled to the drain terminal of the transistor T9. The gate terminal of the transistor T11 serves as the inverting input terminal of the second error amplifier. The source terminal of the transistor T11 is coupled to the source terminal of the transistor T10. The current source IB3 is coupled between the source terminals of the transistors T10 and T11 and the reference low voltage. The second error amplifier shown in FIG. 9 is applicable to the second error amplifier 441 of FIG. 4 and the second error amplifier 541 of FIG. 5. The circuit size of FIG. 9 is approximately one tenth of the circuit size of FIG. 6.

In summary, the voltage regulator may shift the voltage value of the reference voltage signal to generate a set voltage signal and then filter the shifted set voltage signal. The voltage regulating circuit provides an output voltage signal based on the filtered voltage signal. Accordingly, the output voltage signal has very low noise. The voltage regulating circuit also adjusts the voltage value of the filtered voltage signal according to the change of the output voltage signal. Therefore, the voltage value of the output voltage signal can be stabilized. Moreover, the noise of the driving voltage may be filtered to form a filtered driving voltage. Therefore, the voltage regulator has a relatively high power supply rejection ratio.

Although the disclosure has been described with reference to the above embodiments, it will be apparent to one of ordinary skill in the art that modifications to the described embodiments may be made without departing from the spirit and the scope of the disclosure. of the disclosure will be defined by the attached claims and their equivalents and not by the above detailed descriptions.

What is claimed is:

1. A voltage regulator, comprising:
a level shifter configured to shift a voltage value of a reference voltage signal to generate a set voltage signal;
a low-pass filter coupled to the level shifter and configured to filter the set voltage signal to generate a filtered voltage signal;
a voltage regulating circuit coupled to the low-pass filter, configured to output an output voltage signal according to the filtered voltage signal, and adjusting a voltage value of the filtered voltage signal according to a change of the output voltage signal to stabilize a voltage value of the output voltage signal, wherein the voltage regulating circuit comprises:
a first error amplifier, wherein a non-inverting input terminal of the first error amplifier receives the filtered voltage signal, an inverting input terminal of the first error amplifier receives the output voltage signal, and an output terminal of the first error amplifier is used to output a first voltage signal;
a first buffer coupled to the output terminal of the first error amplifier, configured to receive the first voltage signal, providing a second voltage signal according to the first voltage signal, and outputting the second voltage signal at an output terminal of the first buffer; and
a second buffer coupled to the output terminal of the first buffer, configured to receive the second voltage signal, and providing the output voltage signal according to the second voltage signal; and
a compensation circuit coupled to the low-pass filter and the voltage regulating circuit and configured to provide a compensation signal according to the output voltage signal and the filtered voltage signal, wherein the compensation signal is used to compensate a voltage value of the second voltage signal.

2. The voltage regulator according to claim 1, wherein the level shifter comprises:
an operational amplifier, wherein a non-inverting input terminal of the operational amplifier receives the reference voltage signal, and an inverting input terminal of the operational amplifier is coupled to a voltage dividing node;
a first variable resistor coupled between an output terminal of the operational amplifier and the voltage dividing node; and
a second variable resistor coupled between the voltage dividing node and a reference low voltage.

3. The voltage regulator according to claim 1, wherein the compensation signal is a high-frequency signal.

4. The voltage regulator according to claim 1, wherein the compensation circuit comprises:
a second error amplifier, wherein a non-inverting input terminal of the second error amplifier receives the filtered voltage signal, an inverting input terminal of the second error amplifier receives the output voltage signal, and an output terminal of the second error amplifier is used to output a third voltage signal;
a third buffer coupled between the output terminal of the second error amplifier and an output terminal of the first buffer, configured to generate the compensation signal according to the third voltage signal, and providing the compensation signal to the output terminal of the first buffer; and
a high-pass filter is coupled between the output terminal of the second error amplifier and an input terminal of the third buffer.

5. The voltage regulator according to claim 4, wherein the high-pass filter comprises:
a capacitor coupled between the output terminal of the second error amplifier and the input terminal of the third buffer,
a resistor coupled between the input terminal of the third buffer and a bias voltage.

6. The voltage regulator according to claim 4, wherein the second error amplifier is implemented by a transimpedance amplifier (TIA) with a high bandwidth, and a response speed of the second error amplifier is faster than a response speed of the first error amplifier.

7. The voltage regulator according to claim 4, further comprising:
 a driving voltage regulating circuit coupled to the compensation circuit and configured to stabilize a voltage value of a driving voltage used to drive the second error amplifier.

8. The voltage regulator according to claim 7, wherein the driving voltage regulating circuit comprises:
 a low dropout voltage regulator configured to receive the driving voltage and stabilize the driving voltage; and
 a driving voltage low-pass filter coupled to the low dropout voltage regulator and configured to filter mid-frequency and high-frequency noise of the driving voltage to provide a filtered driving voltage.

\* \* \* \* \*